(12) United States Patent
Yu

(10) Patent No.: US 6,297,115 B1
(45) Date of Patent: Oct. 2, 2001

(54) CMOS PROCESSS WITH LOW THERMAL BUDGET

(75) Inventor: Bin Yu, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/303,696

(22) Filed: May 3, 1999

Related U.S. Application Data

(63) Continuation-in-part of application No. 09/187,890, filed on Nov. 6, 1998, now Pat. No. 6,200,869, and a continuation-in-part of application No. 09/187,635, filed on Nov. 6, 1998, now Pat. No. 5,985,726, and a continuation-in-part of application No. 09/187,630, filed on Nov. 6, 1998, now Pat. No. 6,180,476, and a continuation-in-part of application No. 09/187,172, filed on Nov. 6, 1998, now Pat. No. 6,225,173.

(51) Int. Cl.⁷ .................................................. H01L 21/336
(52) U.S. Cl. ........................ 438/305; 438/299; 438/303; 438/595
(58) Field of Search ..................................... 438/305, 290, 438/299, 301, 303, 306, 592, 595

(56) References Cited

U.S. PATENT DOCUMENTS

| | | | |
|---|---|---|---|
| 4,683,645 | * 8/1987 | Naguib et al. | 437/41 |
| 4,745,082 | 5/1988 | Kwok . | |
| 4,784,718 | 11/1988 | Mitani et al. . | |
| 4,835,112 | * 5/1989 | Pfiester et al. | 437/24 |
| 5,264,382 | 11/1993 | Watanabe . | |
| 5,374,575 | 12/1994 | Kim et al. . | |
| 5,391,510 | 2/1995 | Hsu et al. . | |
| 5,393,685 | 2/1995 | Yoo et al. . | |
| 5,429,956 | 7/1995 | Shell et al. . | |
| 5,593,907 | 1/1997 | Anjum et al. . | |
| 5,607,884 | 3/1997 | Byun . | |
| 5,675,159 | 10/1997 | Oku et al. . | |
| 5,716,861 | 2/1998 | Moslehi . | |
| 5,793,090 | 8/1998 | Gardner et al. . | |
| 5,811,323 | 9/1998 | Miyasaka et al. . | |
| 5,825,066 | 10/1998 | Buynoski . | |
| 5,856,225 | 1/1999 | Lee et al. . | |
| 5,858,843 | 1/1999 | Doyle et al. . | |
| 5,908,307 | * 6/1999 | Talwar et al. | 438/199 |
| 5,953,616 | * 9/1999 | Ahn | 438/305 |
| 6,030,863 | * 2/2000 | Chang et al. | 438/229 |
| 6,037,204 | * 3/2000 | Chang et al. | 438/231 |
| 6,072,222 | * 6/2000 | Nistler | 257/383 |
| 6,080,645 | * 6/2000 | Pan | 438/585 |
| 6,103,909 | * 8/2000 | Lee et al. | 438/592 |

FOREIGN PATENT DOCUMENTS

| | | |
|---|---|---|
| 3-248433 | 11/1991 | (JP) . |
| 4-123439 | 4/1992 | (JP) . |
| 5-160396 | 6/1993 | (JP) . |

OTHER PUBLICATIONS

"Low–Dielectric–Constant Materials for ULSI Interlayer–Dielectric Applications", Wei William Lee, MRS Bulletin Oct. 1997 pp. 19–23.

"Sub–100nm Gate Length Metal Gate NMOS Transistors Fabricated by a Replacement Gate Process", A. Chatterjee, International Electronic Device Meeting, 1997, Washington DC, Dec. 7–10, 1997 pp. 821–824.

* cited by examiner

Primary Examiner—Charles Bowers
Assistant Examiner—Jack Chen
(74) Attorney, Agent, or Firm—Foley & Lardner

(57) ABSTRACT

A method of fabricating an integrated circuit with ultra-shallow source/drain junctions utilizes a dual-amorphization technique. The technique creates a shallow amorphous region and a deep amorphous region 300 nm thick. The shallow amorphous region is between 10–15 nm below the top surface of the substrate, and the deep amorphous region is between 60–120 nm below the top surface of the substrate. The shallow amorphous region helps to reduce ion-implantation channeling effects, and the deep amorphous region helps to getter point defects generated during dopant implantation. The process can be utilized for P-channel or N-channel metal field effects semiconductor transistors (MOSFETS) and has a very low thermal budget.

21 Claims, 2 Drawing Sheets

CM OS PROCESSS WITH LOW THERMAL BUDGET

CROSS REFERENCE TO RELATED APPLICATIONS

This patent application is a continuation-in-part application of U.S. application Ser. No. 09/187,890 now U.S. Pat. No. 6,200,869, by Yu et al., entitled "A Method of Fabricating an Integrated Circuit with Ultra-Shallow Drain/Source Extensions", U.S. application Ser. No. 09/187,635, now U.S. Pat. No. 5,985,726, by Yu, et al., entitled "A Damascene Process for Forming Ultra-Shallow Source/Drain Extensions in ULSI MOSFET", U.S. application Ser. No. 09/187,630 now U.S. Pat. No. 6,180,476, by Yu, entitled "Dual Amorphization Implant Process for Ultra-Shallow Drain and Source Extensions", and U.S. application Ser. No. 09/187,172 now U.S. Pat. No. 6,225,173, by Yu, entitled "Recessed Channel Structure for Manufacturing Shallow Source/Drain Extensions", all filed on Nov. 6, 1998, and assigned to the assignee of the present invention.

FIELD OF THE INVENTION

The present invention relates to integrated circuits and to methods of manufacturing integrated circuits. More particularly, the present invention relates to a method of manufacturing integrated circuits in a low thermal budget process.

BACKGROUND OF THE INVENTION

Integrated circuits (ICs), such as, ultra-large scale integrated (ULSI) circuits, can include as many as one million transistors or more. The ULSI circuit often includes complementary metal oxide semiconductor (CMOS) field effect transistors (FET).

Conventional transistors are generally comprised of gates disposed between drain and source regions. The drain and source regions are typically located within a semiconductor film or substrate, and the gates are provided on a top surface of film or substrate. The drain and source regions can be heavily doped with a P-type dopant (e.g., boron) or an N-type dopant (e.g., phosphorous).

The drain and source regions generally include a thin extension that is disposed partially underneath the gate to enhance the transistor performance. Shallow source and drain extensions help to achieve immunity to short-channel effects which degrade transistor performance for both N-channel and P-channel transistors. Short-channel effects can cause threshold voltage roll-off and drain-induced barrier-lowering. Shallow source and drain extensions and, hence, controlling short-channel effects, are particularly important as transistors become smaller.

Conventional techniques utilize a double implant process to form shallow source and drain extensions. According to the conventional process, the source and drain extensions are formed by providing a transistor gate structure without sidewall spacers on a top surface of a silicon substrate. The silicon substrate is doped on both sides of the gate structure via a conventional doping process, such as, a diffusion process or ion implantation process. Without the sidewall spacers, the doping process introduces dopants into a shallow or thin region (i.e., just below the top surface of the substrate) to form the drain and source extensions, as well as to partially form the drain and source regions.

After the drain and source extensions are formed, silicon dioxide spacers, which abut lateral sides of the gate structure, are provided over the source and drain extensions. The substrate is doped a second time to form the deeper source and drain regions. The source and drain extensions are not further doped due to the blocking capability of the silicon dioxide spacer.

As transistors disposed on integrated circuits (ICs) become smaller, transistors with shallow and ultra-shallow source/drain extensions have become more difficult to manufacture. For example, smaller transistors should have ultra-shallow source and drain extensions (less than 30 or 40 nanometer (nm) junction depth). Forming source and drain extensions with junction depths of less than 30 nm is very difficult using conventional fabrication techniques. Conventional ion implantation and diffusion doping techniques make transistors on the IC susceptible to short-channeling effects, which result in a dopant profile tail distribution that extends deep into the substrate. Also, conventional ion implantation techniques have difficulty maintaining shallow source and drain extensions because point defects generated in bulk semiconductor substrate during ion implantation can cause the dopant to diffuse more easily (transient enhanced diffusion, TED). The diffusion often extends the source and drain extension vertically into the bulk semiconductor substrate.

Heretofore, CMOS processes have required furnace anneal processes, rapid thermal anneal (RTA) processes, and spike RTA processes to temporarily heat the substrate. The heating processes are required to diffuse and to activate dopants in polysilicon gate materials, in the source region, and in the drain region. Additionally, heating processes are also utilized during the deposition of certain materials, the silicidation of metals, and other fabrication steps. The heating processes significantly increase the thermal budget of the CMOS process. For example, even spike RTA processes subject the substrate to at least one second of high temperature treatment (e.g., over 900° C.).

The total thermal budget dopants experienced by the IC becomes more critical as transistors become smaller. For example, dopants in the source region, drain region, and gate region diffuse more readily in response to high temperatures. Accordingly, high temperatures can adversely affect ultra-shallow junction formation, the formation of ultra-tight dopant profiles for halo implants and retrograde channel implants, and dopant penetration into the gate (boron penetration into the gate of a P-channel transistor). Ultra-shallow junctions and tight profile pocket regions improve immunity to short-channel effects, such as, threshold voltage roll-off. Short-channel effects are a major barrier to appropriate transistor scaling.

Thus, there is a need for a method of manufacturing a transistor that does not utilize a conventional annealing process step. Further still, there is a need for transistors that can be manufactured within a low thermal budget. Even further still, there is a need for an efficient method of manufacturing source and drain extensions that minimizes ion implantation channeling effect.

SUMMARY OF THE INVENTION

The present invention relates to a method of manufacturing an integrated circuit. The method includes forming at least a portion of a gate structure on a top surface of a silicon substrate, providing a first amorphization implant. The gate structure includes an amorphous layer, and the amorphization implant creates a first amorphous region near the top surface of the substrate. The method further includes providing spacers which abut the gate structure, providing a second amorphization implant, doping the substrate in the amorphous layer, and thermally annealing the substrate. The second amorphization implant creates a deep amorphous region in the substrate.

The present invention further relates to a method of manufacturing an ultra-large scale integrated circuit including a plurality of field effect transistors. The method includes steps of forming at least part of a gate structure on a top surface of a semiconductor substrate, providing a shallow amorphization implant, providing spacers, providing a deep amorphization implant, doping the substrate to form source and drain regions, and thermally annealing the substrate in a low thermal budget process. The shallow amorphization implant creates a shallow amorphous region near the top surface, and the deep amorphization implant creates a deep amorphous region in the substrate. The spacers abut the gate structure.

The present invention even further still relates to a method of fabricating field effect transistors associated with an ultra-large scale integrated circuit. The method includes forming a plurality of at least a portion of gate structures on a top surface of a silicon substrate, providing a first amorphization implant, providing spacers, providing a second amorphization implant, doping the substrate, providing a dielectric layer over the gate structure and the substrate, providing a metal layer over the dielectric layer, and annealing the substrate. The first amorphization implant creates a first amorphous region near the top surface of the substrate. The second amorphization implant creates a deep amorphous semiconductor region in the substrate.

BRIEF DESCRIPTION OF THE DRAWINGS

Exemplary embodiments of the present invention will be described with reference to the accompanying drawings, wherein like numerals denote like elements and.

DETAILED DESCRIPTION OF THE PREFERRED EXEMPLARY EMBODIMENTS

Figure 1:
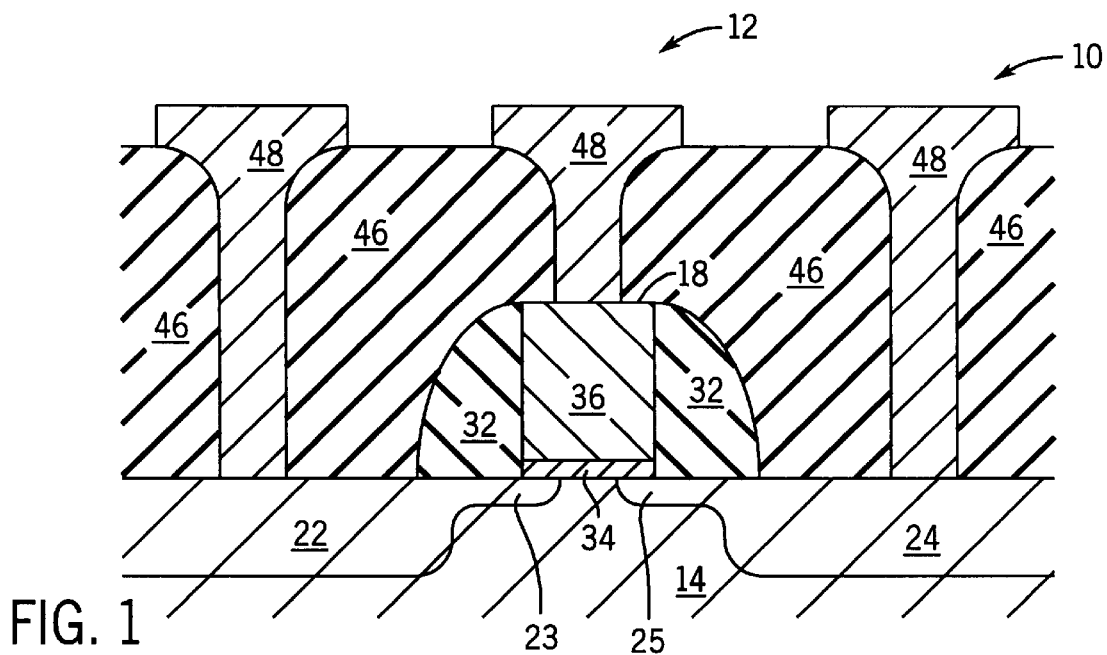
FIG. 1 is a cross-sectional view of a portion of an integrated circuit having a transistor manufactured in accordance with an exemplary embodiment of the present invention.

With reference to FIG. 1, a portion 10 of an integrated circuit (IC) includes a transistor 12 that is disposed on a semiconductor substrate 14, such as, a single crystal silicon wafer. Transistor 12 includes a gate structure 18, a source region 22, and a drain region 24. Transistor 12 also includes a source extension 23 and a drain extension 25. Alternatively, transistor 12 can be fabricated on a thin film, a GaAs substrate, or other base layer.

Extensions 23 and 25 are preferably ultra-shallow extensions (e.g., junction depth less than 30–40 nanometers (nm)), which are thinner than regions 22 and 24. Extensions 23 and 25 are connected to regions 22 and 24, respectively, and are disposed partially underneath a dielectric layer 34. Ultra-shallow extensions 23 and 25 help transistor 12 achieve substantial immunity to short-channel effects. Short-channel effects can degrade performance of transistor 12, as well as the manufacturability of the IC associated with transistor 12.

Transistor 12 can be an N-channel or a P-channel field effect transistor, such as, a metal oxide semiconductor field effect transistor (MOSFET). Transistor 12 is preferably part of an ultra-large scale integrated (ULSI) circuit that includes one million or more transistors.

Gate structure 18 includes spacers 32, dielectric layer 34, and a polysilicon gate conductor 36. Gate oxide 34 is preferably thermally grown on substrate 14 as a silicon dioxide layer. Spacers 32 and gate conductor 36 are preferably deposited by chemical vapor deposition (CVD) and etched to form the particular structures for transistor 12. Spacers 32 can be silicon dioxide or silicon nitride ($Si_3N_4$). Dielectric layer 34 can be from 2–8 nm thick. Alternatively, a high-K gate dielectric material and a low-K dielectric spacer material can be utilized.

Transistor 12 can be covered by an insulating layer 46. Insulating layer 46 is preferably a silicon dioxide material deposited by CVD in a tetraorthosilicate (TEOS) process. Alternatively, other dielectric materials can be utilized for layer 46. Layer 46 is selectively etched to form holes for contacts 48. Contacts 48 couple to source region 22, drain region 24, and gate conductor 36.

The fabrication of transistor 12 is discussed below with reference to FIGS. 1–7. According to an exemplary embodiment, transistor 12 is advantageously fabricated in accordance with a low or zero thermal budget after gate structure 18 is initially provided. Any necessary annealing steps, (after gate structure 18 is provided) can be performed by an excimer laser to maintain the thermal budget at a low level. Excimer laser anneals generally last several nanoseconds (6 orders of magnitude less than conventional rapid thermal anneals (RTAs)).

Figure 2:
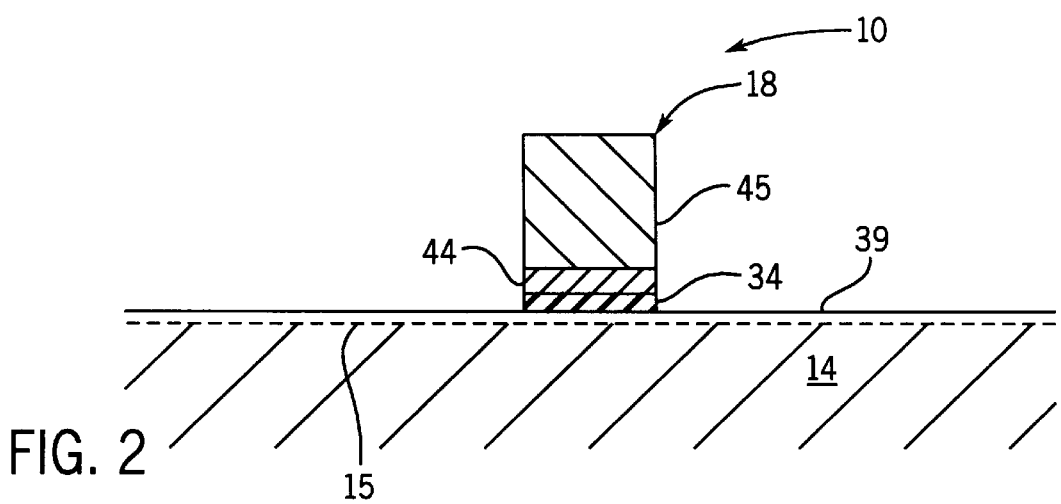
FIG. 2 is a cross-sectional view of the portion of the integrated circuit illustrated in FIG. 1, showing a gate stack formation step.

With reference to FIG. 2, conventional CMOS fabrication techniques can be utilized to form gate structure 18 on a top surface 39 of substrate 14. Gate structure 18 is preferably provided after conventional threshold adjustment implants are provided to substrate 14, followed by a rapid thermal anneal (RTA) to activate dopants within substrate 14. A threshold adjustment implant 15 is shown as a dashed line in FIG. 2.

Gate structure 18 is formed by depositing or growing dielectric layer 34 on top of top surface 39 of substrate 14. Dielectric layer 34 can be silicon dioxide. Alternatively, dielectric layer 34 can be silicon nitride, a high-k gate dielectric material, or other insulator deposited by CVD, plasma enhanced CVD (PECVD), or other process.

A bottom conductive layer 44 is provided over dielectric layer 34. Conductive layer 44 is preferably polysilicon having a thickness of 100–300 Å and is deposited by CVD. A top conductive layer 45 is deposited over bottom conductive layer 44. Top conductive layer 45 is preferably amorphous silicon which has a thickness of approximately 1000 Å. Alternatively, layers 44 and 45 can be polysilicon/ germanium layers. Dielectric layer 34 preferably has a thickness between 20 and 50 Å. Accordingly, gate structure 18 preferably has a thickness approximately 1100 to 1400 Å for CMOS technology generations with a gate line width of 50 nm and less. Gate structure 18 is patterned by E-beam lithography and is isotropically dry-etched to leave gate structure 18 as shown in FIG. 2.

Figure 3:
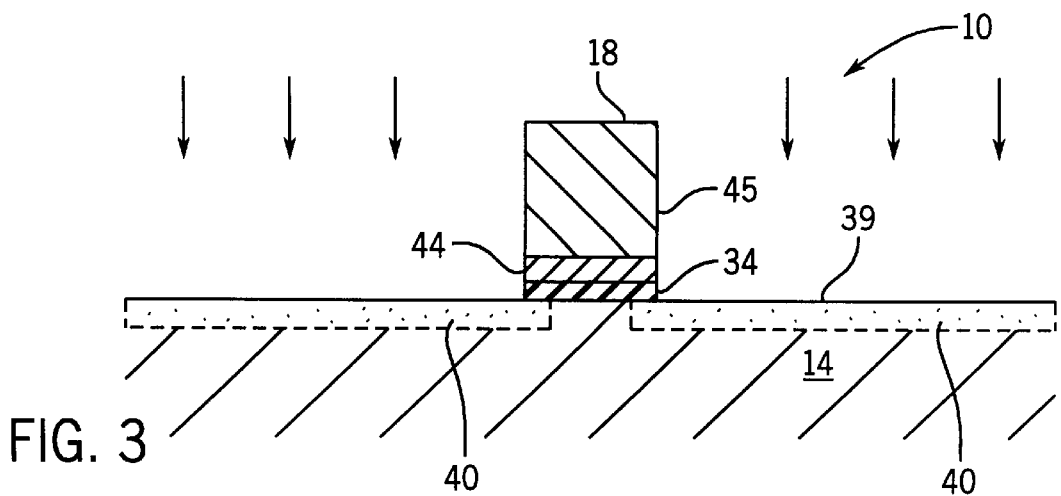
FIG. 3 is a cross-sectional view of the portion of the integrated circuit illustrated in FIG. 1, showing a first amorphization implant step.

After gate structure 18 is formed, portion 10 and substrate 14 are subjected to a shallow amorphization implant. With reference to FIG. 3, the shallow amorphization implant forms implant regions 40 (shown as a stippled area in FIGS. 4–6). Implant regions 40 are preferably amorphous silicon and are extend between 10–30 nm below top surface 39 of substrate 14. Implant regions 40 can be created by subjecting substrate 14 to an ion implantation technique. Implant regions 40 are utilized to form extensions 23 and 25 (FIG. 1), as described below with reference to FIG. 6.

The ion implantation conditions may be silicon or germanium ions to 5–20 kiloelectron volts (keVs) (low energy level) at a dose of $4 \times 10^{14}$ dopants per centimeter squared ($cm^2$). Ion implantation can be performed by implantation devices manufactured by companies, such as, Varian, Inc. of Palo Alto, Calif., Genius, Inc., and Applied Materials, Inc. The silicon and germanium ions change the single crystal silicon associated with substrate 14 into amorphous silicon at implant regions 40. Implant regions 40 are preferably very thin regions.

Figure 4:
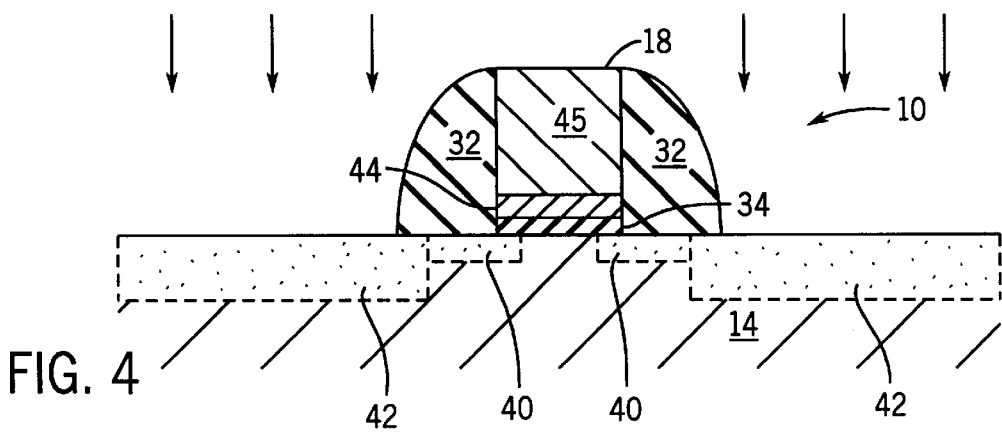
FIG. 4 is a cross-sectional view of the portion of the integrated circuit illustrated in FIG. 1, showing a second amorphization implant step.

With reference to FIG. 4, after implant regions 40 are formed, the material for spacers 32 is deposited. The material for spacers 32 is deposited at a temperature less than 400° C. to avoid recrystillization of implant region 40 and conductive layer 45. The material for spacers 32 is preferably deposited by low temperature CVD (LTCVD) as a 1200 to 1500 Å layer of silicon dioxide or silicon nitride that is etched back in a conventional process. Spacers 32 abut structure 18.

After spaces 32 are formed, substrate 14 is subjected to a deep amorphization implant to form implant regions 42. Implant regions 42 are preferably amorphous silicon at a depth of approximately 60–120 nm. Implant regions 42 are formed by subjecting substrate 14 to an ion implantation technique, wherein silicon or germanium ions are implanted to create an amorphous region or layer with a depth between 60–120 nm. Implant regions 42 are represented as a stippled area in the FIGS. 4–6. The ion implantation techniques for forming implant regions 42 are similar to the techniques for forming implant regions 40, except that the ions used to form implant regions 42 have more energy. Preferably, germanium ions are implanted at an energy level of 50–90 KeV (medium energy level) and at a dose of $1 \times 10^{15}$ dopant/$cm^2$.

Figure 5:
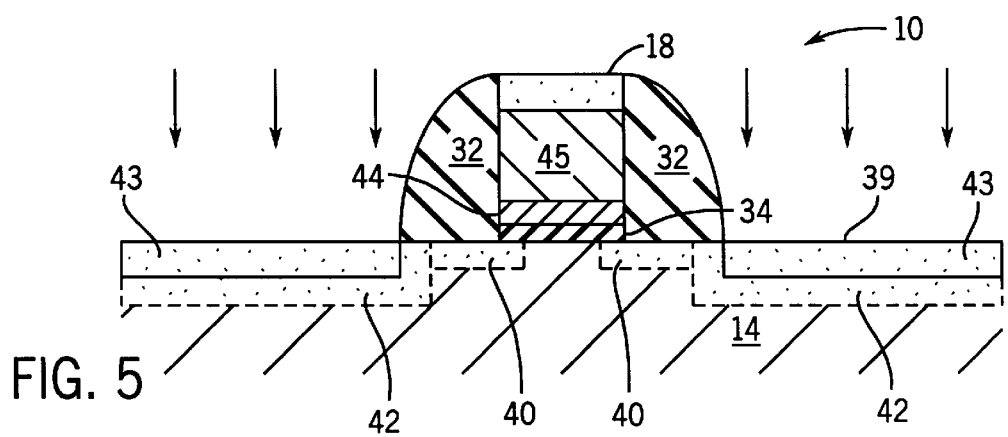
FIG. 5 is a cross-sectional view of the portion of the integrated circuit illustrated in FIG. 1, showing a dopant implant step.

In FIG. 5, substrate 14 is subjected to a dopant implant 43, represented by a shaded region below surface 39 of substrate 14. The dopant implant 43 can be arsenic, boron diflouride ($BF_2$), indium, phosphorous, or any appropriate dopant for semiconductor fabrication operations. Dopant implant 43 is performed at a dose of $10^{15}$ dopants per $cm^2$. Preferably, heavier dopants As, Sb, or $BF^2$ are utilized. The depth of the implant projection is half the depth of implant region 42, or 30–60 nm.

Figure 6:
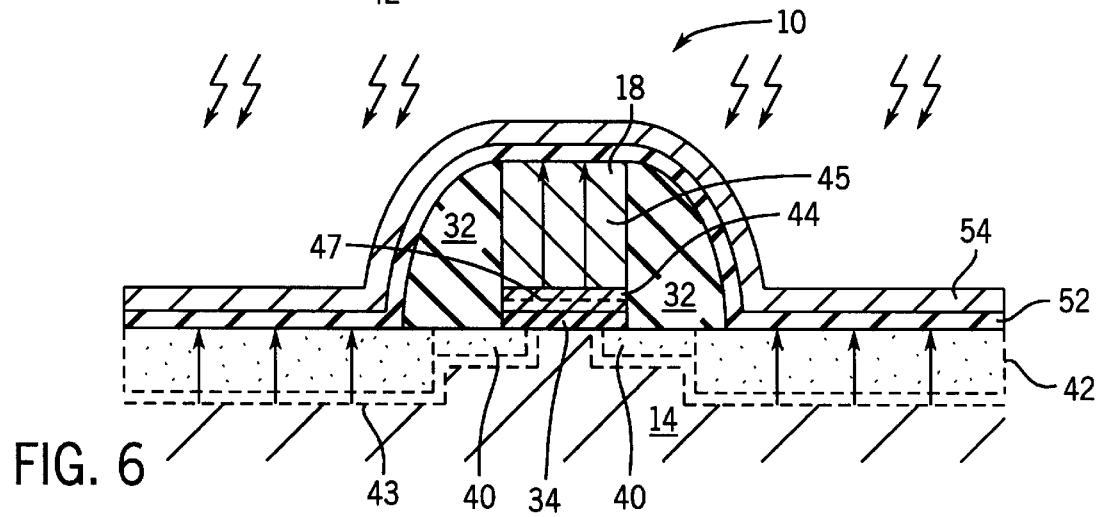
FIG. 6 is a cross-sectional view of the portion of the integrated circuit illustrated in FIG. 1, showing a laser anneal step.

With reference to FIG. 6, portion 10 is covered by a dielectric layer 52 and a metal layer 54. Dielectric layer 52 is preferably a 10 nm thick silicon dioxide layer deposited by LT CVD. Metal layer 54 is preferably a 10–20 nm thick titanium, tantalum, or tungsten layer deposited by LT CVD. After layers 52 and 54 are deposited, substrate 14 is subjected to an excimer laser pulse. Preferably, portion 10 is exposed to a fluence of few hundred joules per $cm^2$ for a duration of several nanoseconds (e.g., less than 10). The energy associated with the excimer laser pulse is controlled so that the melting front is slightly deeper than the lower boundary of implant regions 42 in substrate 14 and conductive layer 45 in gate structure 18. Preferably, the melting front in gate structure 18 is 5 nm lower than the bottom surface of conductive layer 45 (thus, extending into layer 44), and the melting front in substrate 14 is 5 nm lower than the bottom of implant region 42. The melting front is demonstrated by a dotted line 47 for structure 18 and a dotted line 43 in substrate 14.

The laser pulse recrystalizes the amorphous material in implant regions 40 and 42 from the bottom of the melting layer, which acts as a seed structure for crystal growth. Crystal regrowth is complete even though the duration of the laser time is short. Conductive layer 45 (amorphous silicon) is also melted during the laser exposure and recrystalized into polysilicon from the bottom upward seeded by the melting front in conductive layer 44. Preferably, the energy of the fluence of the laser is controlled so only amorphous silicon in conductive layer 45 is melted. Metal layer 54 ensures that laser energy is more effectively absorbed by portion 10. Implant regions 40 allow dopants from dopant implant 43 to migrate underneath gate structure 18 and to form extensions 23 and 25. Dielectric layer 52 acts as a diffusion barrier to prevent metal diffusion into silicon during the excimer laser process.

Figure 7:
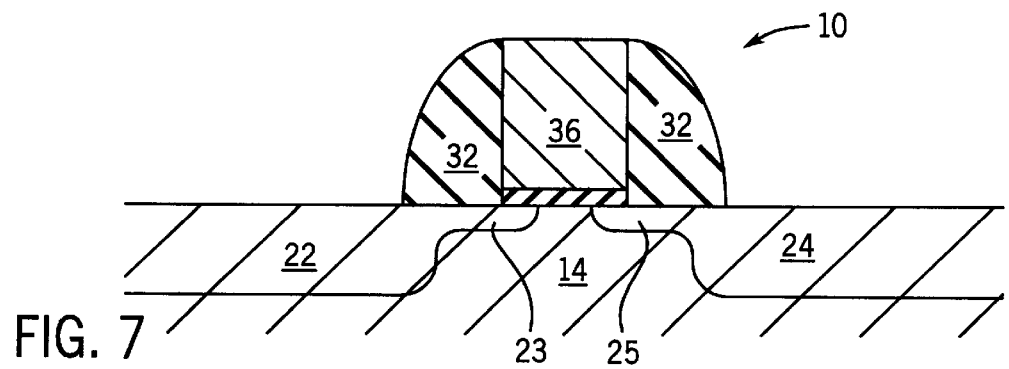
FIG. 7 is a cross-sectional view of the portion of the integrated circuit illustrated in FIG. 1, showing a recrystallization step.

With reference to FIG. 7, layers 54 and 52 are stripped from portion 10 by a wet chemical-etching process. Alternatively, other removal process can be utilized. The crystal regrowth process leaves source region 22 and drain region 24 with extensions 23 and 25, respectively. Conductive layers 45 and 44 in structure 18 are shown in FIG. 7 as a uniform polysilicon conductor 36.

With reference to FIG. 1, conventional processes can be utilized to form insulating layer 46 and contacts 48. Conventional CMOS processes can be utilized to complete the formation of transistor 12 and portion 10 and other formations on substrate 14.

It is understood that, while preferred embodiments, examples, materials, and values are given, they are for the purpose of illustration only. The apparatus and method of the invention are not limited to the precise details and conditions disclosed. For example, although two fabrication methods utilizing ion implantation are discussed, other dual-amorphization techniques and methods could utilize the principles of the present invention to create ultra-shallow source and drain extensions. Thus, changes may be made to the details disclosed without departing from the spirit of the invention, which is defined by the following claims.

What is claimed is:

1. A method of manufacturing an integrated circuit, comprising:

forming at least a portion of a gate structure on a top surface of a silicon substrate, the gate structure including an amorphous layer, the amorphous layer being deposited in an amorphous state;

providing a first amorphization implant, the first amorphization implant creating a first amorphous region near the top surface of the silicon substrate;

providing spacers, the spacers abutting the gate structure;

providing a second amorphization implant, the second amorphization implant creating a deep amorphous region in the silicon substrate;

then doping the silicon substrate and the amorphous layer, wherein said doping the silicon substrate creates a source region and a drain region; and thermally annealing the silicon substrate.

2. The method of claim 1, wherein the deep amorphous region is 60–120 nm below the top surface of the silicon substrate.

3. The method of claim 2, wherein the first amorphous region is 10–30 nm below the top surface of the silicon substrate.

4. The method of claim 1, wherein the gate structure includes a lower polysilicon layer beneath and abutting the amorphous layer, and the thermally annealing step provides a melting front extending lower than a lower boundary of the deep amorphous region and also lower than a lower boundary of the amorphous layer.

5. The method of claim 1, wherein the thermally annealing step is a laser annealing step having a fluence of a few hundred joules.

6. The method of claim 5, wherein the fluence is provided for several nanoseconds.

7. The method of claim 1, wherein the thermally annealing step provides a melting front extending lower than a lower boundary of the deep amorphous region.

8. The method of claim 7, wherein the melting front is 5 nm or less below the lower boundary.

9. The method of claim 1, wherein the thermally annealing step is a laser-annealing step having a fluence of less than 1000 joules and an exposure of less than 10 nanoseconds.

10. A method of manufacturing an ultra-large scale integrated circuit including a plurality of field effect transistors, the method comprising steps of:

forming at least part of a gate structure on a top surface of a semiconductor substrate, the gate structure including a polysilicon layer and an amorphous layer, the amorphous layer being deposited in an amorphous state;

providing a shallow amorphization implant, the shallow amorphization implant creating a shallow amorphous region near the top surface of the semiconductor substrate;

providing spacers, the spacers abutting the gate structure;

providing a deep amorphization implant, the deep amorphization implant creating a deep amorphous region in the semiconductor substrate;

then doping the semiconductor substrate to form source and drain regions; and thermally annealing the semiconductor substrate in a low thermal budget process.

11. The method of claim 10, wherein the doping the semiconductor substrate step further includes doping the amorphous layer of the gate structure.

12. The method of claim 11, wherein the doping the semiconductor substrate step utilizes As or $BF_2$.

13. The method of claim 10, wherein the gate structure includes a polysilicon layer underneath the amorphous layer.

14. The method of claim 13, wherein the providing spacers step is performed at a temperature less than 400° C.

15. The method of claim 10, further comprising depositing a dielectric layer over the gate structure and the semiconductor substrate.

16. A method of fabricating field effect transistors associated with an ultra-large scale integrated circuit, the method comprising:

forming at least a portion of a gate structure on a top surface of a silicon substrate, the gate structure including an amorphous layer, the amorphous layer being deposited in an amorphous state;

providing a first amorphization implant, the first amorphization implant creating a first amorphous semiconductor region near the top surface of the silicon substrate;

providing spacers, the spacers abutting the gate structure;

providing a second amorphization implant, the second amorphization implant creating a deep amorphous semiconductor region in the silicon substrate;

then doping the silicon substrate to form a source region and a drain region;

providing a dielectric layer over the gate structure and the silicon substrate;

providing a metal layer over the dielectric layer; and annealing the silicon substrate.

17. The method of claim 16, wherein the gate structure includes a polysilicon layer.

18. The method of claim 17, wherein the first amorphous semiconductor region is less than 10–30 nm below the top surface of the silicon substrate, and the deep amorphous semiconductor region is 60–120 nm below the top surface of the silicon substrate.

19. The method of claim 18, wherein the dielectric layer is less than 10 nm thick.

20. The method of claim 18, wherein the metal layer is less than 20 nm thick.

21. A method of forming source and drain regions in a low thermal budget process, the method comprising:

forming a gate conductor including an amorphous layer, the amorphous layer being deposited in an amorphous state;

providing a shallow amorphization implant, the shallow amorphization implant creating a shallow amorphous region near the top surface of a substrate;

providing a deep amorphization implant, the deep amorphization implant creating a deep amorphous region in the substrate;

then doping the substrate to form source and drain regions; and thermally annealing the substrate in a low thermal budget process, wherein the thermally annealing step melts the deep amorphous region.

* * * * *